United States Patent [19]
Kingston et al.

[11] Patent Number: 5,134,631
[45] Date of Patent: Jul. 28, 1992

[54] DIGITAL GAIN CONTROLLER

[75] Inventors: Samuel C. Kingston; Steven T. Barham, both of Salt Lake City; Harold L. Simonsen, West Valley City, all of Utah

[73] Assignee: Unisys Corp., Blue Bell, Pa.

[21] Appl. No.: 559,018

[22] Filed: Jul. 26, 1990

[51] Int. Cl.[5] .............................................. H04K 1/00
[52] U.S. Cl. .......................................... 375/1; 380/34; 455/136; 455/240.1
[58] Field of Search ........................ 375/1, 98; 380/34; 455/59.2, 136, 138, 240, 245

[56] References Cited

U.S. PATENT DOCUMENTS

| | | |
|---|---|---|
| 4,225,976 | 9/1980 | Osborne et al. .................. 375/1 X |
| 4,672,629 | 6/1987 | Beier ...................................... 375/1 |
| 4,736,390 | 4/1988 | Ward et al. ........................ 375/1 X |
| 4,890,297 | 12/1989 | Zscheile, Jr. et al. ................. 375/1 |
| 5,022,048 | 6/1991 | Kingston et al. ..................... 375/1 |

Primary Examiner—Tod R. Swann
Attorney, Agent, or Firm—John B. Sowell; Mark T. Starr; Thomas J. Scott

[57] ABSTRACT

A novel programmable digital gain controller is provided for the automatic gain control loop of a communications receiver. The digital gain controller comprises a pair of digital detectors coupled to the real and imaginary components of a data stream for providing digital data magnitude output signals which are coupled to an adder whose output is coupled to a first input of a comparator having a second input coupled to a predetermined reference level command. The output of the comparator generates a digital error signal which is coupled to the input of a programmable gain accumulator having a second input proportional gain command so as to provide at the output of the programmable gain accumulator a digital gain command which may be coupled to a variable gain controlled amplifier which is connected in the input data stream of the channel of a communications receiver to provide a predetermine amplifier output level.

11 Claims, 4 Drawing Sheets

DIGITAL GAIN CONTROLLER

BACKGROUND OF THE INVENTION

1. Field of the Invention

The present invention relates to digital automatic gain controllers (AGC) of the type that may be programmed by a microprocessor (uP) or a remote controller. More particularly, the present invention relates to a novel automatic digital gain controller for digital communication receivers. A feature of the automatic gain controller is to provide very fast recovery from interference and jamming signals which would saturate the analog to digital converters which in turn would substantially decrease the sensitivity of the receiver.

2. Description of the Prior Art

Heretofore, digital communication receivers and spread spectrum communication systems of the type adapted to be immune to interception and jamming have been proposed. Such proposed systems have various types of encoding and decoding apparatus and modulation codes.

A proposed programmable anti-jam Modem is generally described in a report entitled "Design Plan (Draft) VHSIC AJ Modem" U.S. Government Contract DAAK-20-83-G-0454 dated Jul. 30, 1984 by Hughes Aircraft Company Communication System Division in Fullerton, Calif. This proposed modem does not teach or suggest an all digital gain controller or the problems introduced by jamming signals which drive the receiver data signals into saturation so that the desired data signals cannot be easily recovered.

The problem generated by burst jamming signals in communications receivers is discussed in U.S. Pat. No. 4,890,297 issued Dec. 26, 1989, and entitled Burst Jammer Erasure Circuits for Spread Spectrum Receivers. This patent was issued to Unisys Corporation, the assignee of the present application, and is directed to a solution using analog devices in the recovery loop.

It would be desirable to provide a novel digital gain controller that is cheaper and simpler than prior art gain controllers adapted to operate in hostile signal noise and jamming environments.

SUMMARY OF THE INVENTION

It is a primary object of the present invention to provide a novel programmable digital gain controller.

It is a primary object of the present invention to provide a simple automatic gain controller which may be implemented using all digital circuitry of the type which can be included on a single large scale integrated circuit with other components.

It is another primary object of the present invention to provide a digital gain controller having programmable loop gain and programmable reference level inputs.

It is another primary object of the present invention to provide apparatus for very fast recovery from jamming signals so as to enhance sensitivity and recovery of data.

It is another primary object of the present invention to employ downstream digital samples to the input of the novel gain controller to eliminate upstream gain variations.

It is another primary object of the present invention to provide an ideal first order gain control loop having a digital programmable accumulator which acts as an ideal integrator and provides zero error steady state response.

According to these and other objects of the present invention there is provided a digital gain controller having an input circuit for detecting and adding the energy levels of the data in the real and imaginary base band channels of a data stream which are then compared with a programmable reference level to provide an error signal. The error signal is connected to a programmable gain accumulator to provide an output gain command which is employed to control a variable gain preamplifier in the data stream. A fast acting saturation detector connected to the data stream is also coupled to the gain accumulator and provides a overriding control signal to suppress the output gain signal to the variable gain amplifier in the event the signals in the data stream become saturated because of sharp increases of input signal levels such as those caused by jamming signals.

DESCRIPTION OF THE PREFERRED EMBODIMENT

Figure 1:
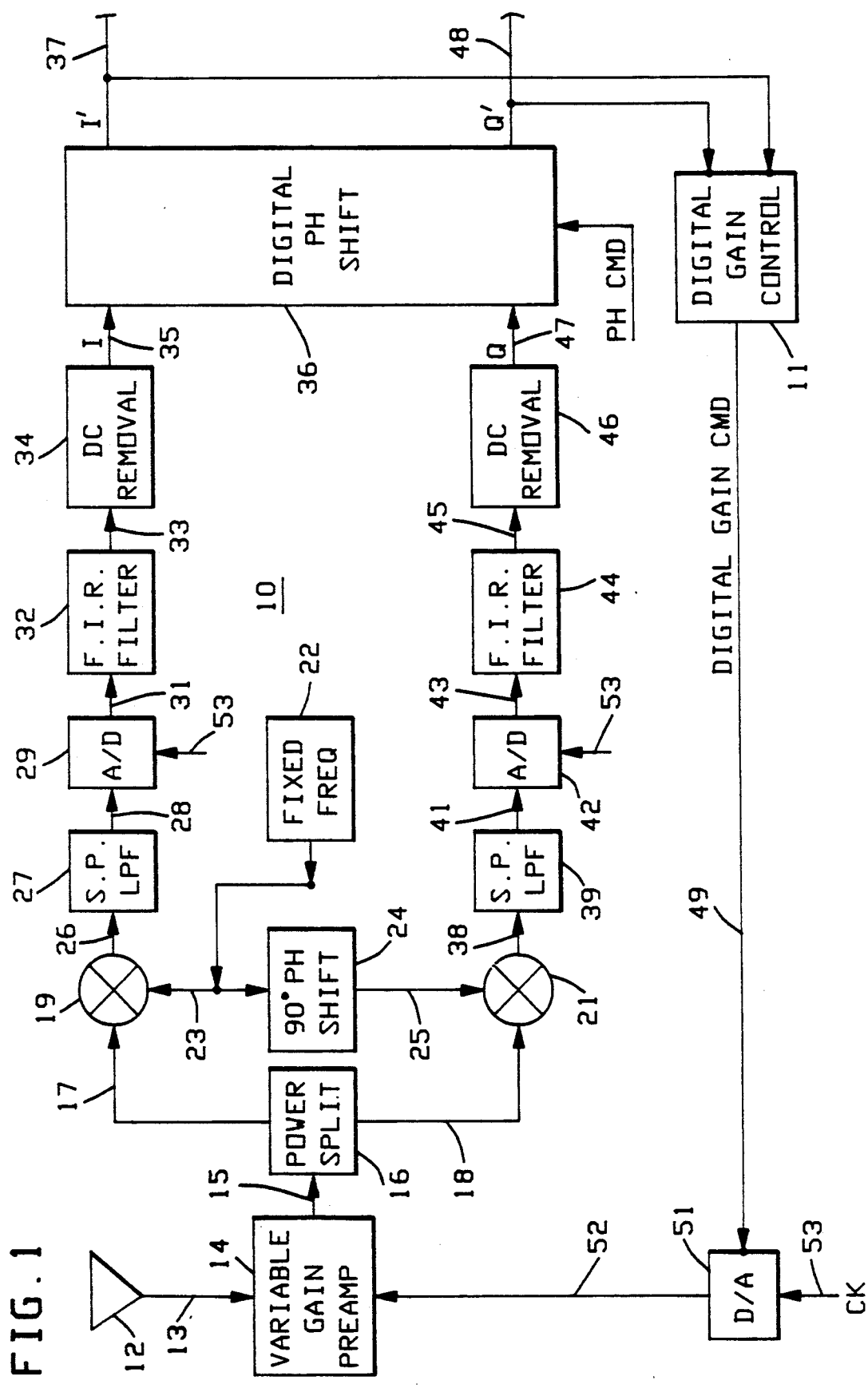
FIG. 1 is a schematic block diagram of a communications receiver pre-processing circuitry illustrating a preferred embodiment use of the present invention programmable digital gain controller.

Refer now to FIG. 1 showing the present invention programmable digital gain controller 11 connected to a data stream of a digital sample data communications receiver 10. The radio frequency signals received by the antenna 12 are coupled via line 13 as analog signals to a variable gain preamplifier 14 to provide a controlled level output signal on line 15 to power splitter 16. The RF analog signal on lines 17 and 18 are applied to a pair of mixers 19 and 21 connected to the real and imaginary channels I and Q respectively. A fixed frequency oscillator 22 has an output on line 23 which is connected to mixer 19 and to a 90° phase shifter 24 which provides a quadrature output on line 25 to mixer 21. The real analog RF signal on line 26 is applied to a single pole low pass filter 27 to provide a filtered analog output signal on line 28. The analog signal at the input of A to D converter 29 is converted to a digital output on line 31 which is applied to a finite impulse response (FIR) filter 32 to provide a filtered digital signal or line 33 which has some D.C. component that is removed by D.C. removal circuit 34 to provide the real digital signal on line 35. The real digital signal on line 35 is applied to a digital phase shifter 36 of the type set forth in my U.S. Pat. No. 4,841,552 to provide a phase shifted signal on line 37 shown as I'.

In a manner similar to that described above, the output signal on line 38 in the imaginary channel Q is applied to a low pass filter 39 whose output on line 41 is applied to an A to D converter 42. The digital output on line 43 is applied to a filter 44 and the filtered output on line 45 is applied to a D.C. removal circuit 46 of the type which will be explained in greater detail hereinafter to provide the imaginary digital signal Q on line 47. The imaginary signal Q on line 47 is applied to the digital phase shifter 36 of the type described in U.S. Pat. No. 4,841,552 to provide the phase shifted imaginary signal Q, on line 48. The real and imaginary signals on line 37 and 48 are connected to a preferred embodiment digital gain controller 11 to provide a digital gain command on line 49 which is shown connected to digital to analog converter 51. The analog output on line 52 is connected to the analog variable gain preamplifier 14 to control the output signal on line 15 at a predetermined controlled level. When the variable gain preamplifier is provided with a digital input, the digital gain command on line 49 may be coupled directly to the preamplifier 14 so as to eliminate the D to A converter 51. Clock strobe signals such as that shown on line 53 are applied to the digital blocks which occur after the A to D converters 29 and 42. The low pass filters 27 and 39 may be constructed as RC filter circuits and the FIR filters 32 and 44 may be constructed in the manner shown in my U.S. Pat. No. 4,808,939. It will be understood that all of schematic blocks shown in the FIG. 1 embodiment need not be constructed according to my previously mentioned patents but may be constructed by other equivalent circuits known in the prior art.

Figure 2:
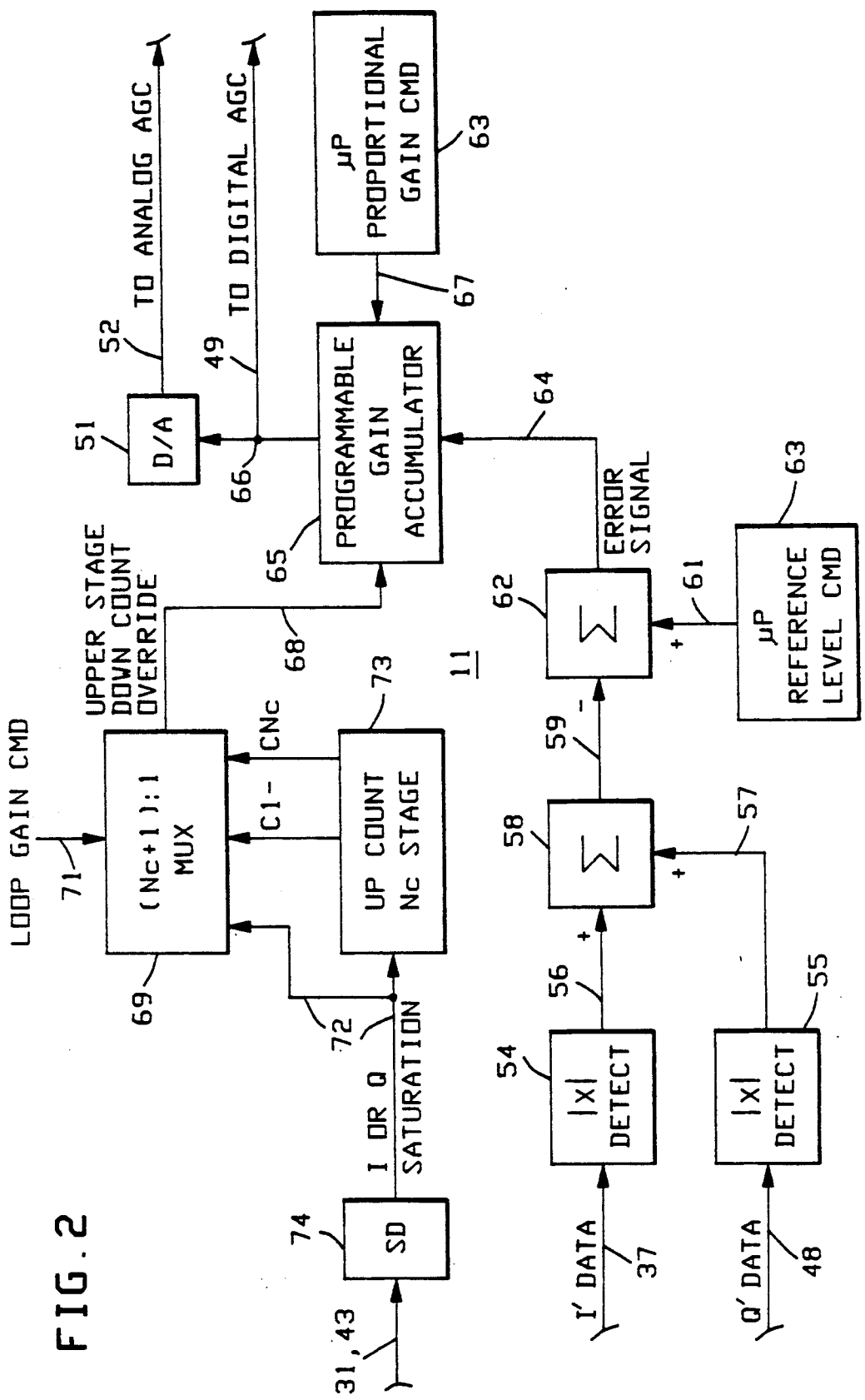
FIG. 2 is a schematic block diagram of a preferred embodiment programmable digital gain controller shown in FIG. 1.

Refer now to FIG. 2 showing a schematic block diagram of the novel preferred embodiment programmable digital gain controller 11 having real and imaginary input signals on input lines 37 and 48. The phase shifter rotated digital data signals on lines 37 and 48 are shown connected to absolute value detectors 54 and 55 which measure the value of the magnitude of the input signals and provide digital magnitude values on output lines 56 and 57 respectively. The signals on line 56 and 57 could be generated by square law detectors instead of absolute value detectors or other equivalent detectors which provide signal magnitude values that are applied to a summing circuit 58 which serves as an adder. The output of the adder 58 on line 59 is subtracted from the level command input on line 61 in comparator or subtractor 62. The microprocessor reference level command is preferably from an offchip microprocessor or controller 63 which permits offchip control. The output of comparator 62 on line 64 provides a digital error signal which is applied to a programmable gain accumulator 65 of the type which continuously accumulates positive and negative error signals to provide a preferred command signal on output line 66. As mentioned hereinbefore, the gain command signal on line 66 may be applied directly to a variable gain preamplifier 14 or converted to an analog signal before being applied to the automatic gain control amplifier described hereinbefore. Accordingly, the D to A converter 51 and the output lines are numbered the same as those in FIG. 1 to show continuity between the drawings.

The same microprocessor 63 which provides the level command may also provide a proportional gain command on line 67 to the programmable gain accumulator 65. A third input on line 68 to programmable gain accumulator 65 is labeled upper stage downcount override signal and is shown as the output of a carry bit select multiplexor 69. The aforementioned microprocessor 63 also provides a loop gain command on line 71 which describes the desired saturation loop gain. Digital signals from the real and imaginary channels I and Q on lines 31 and 43 are shown connected via a saturation detector 74 and line 72 to an up counter 73 shown having $N_c$ stages. The signal on line 72 is derived from the signals on lines 31 and 43 which are applied to a saturation detector 74 and are indicative of whether the I or Q A/D converter values are at maximum or minimum levels. The up counter 73 is synchronized with the system clock so as to continuously count indications of saturation values. The carries from the counter 73 in the different stages are applied to the multiplexor 69 to enable selection of the number of saturation counts per gain down count override on line 68 to the programmable gain accumulator 65.

Figure 3:
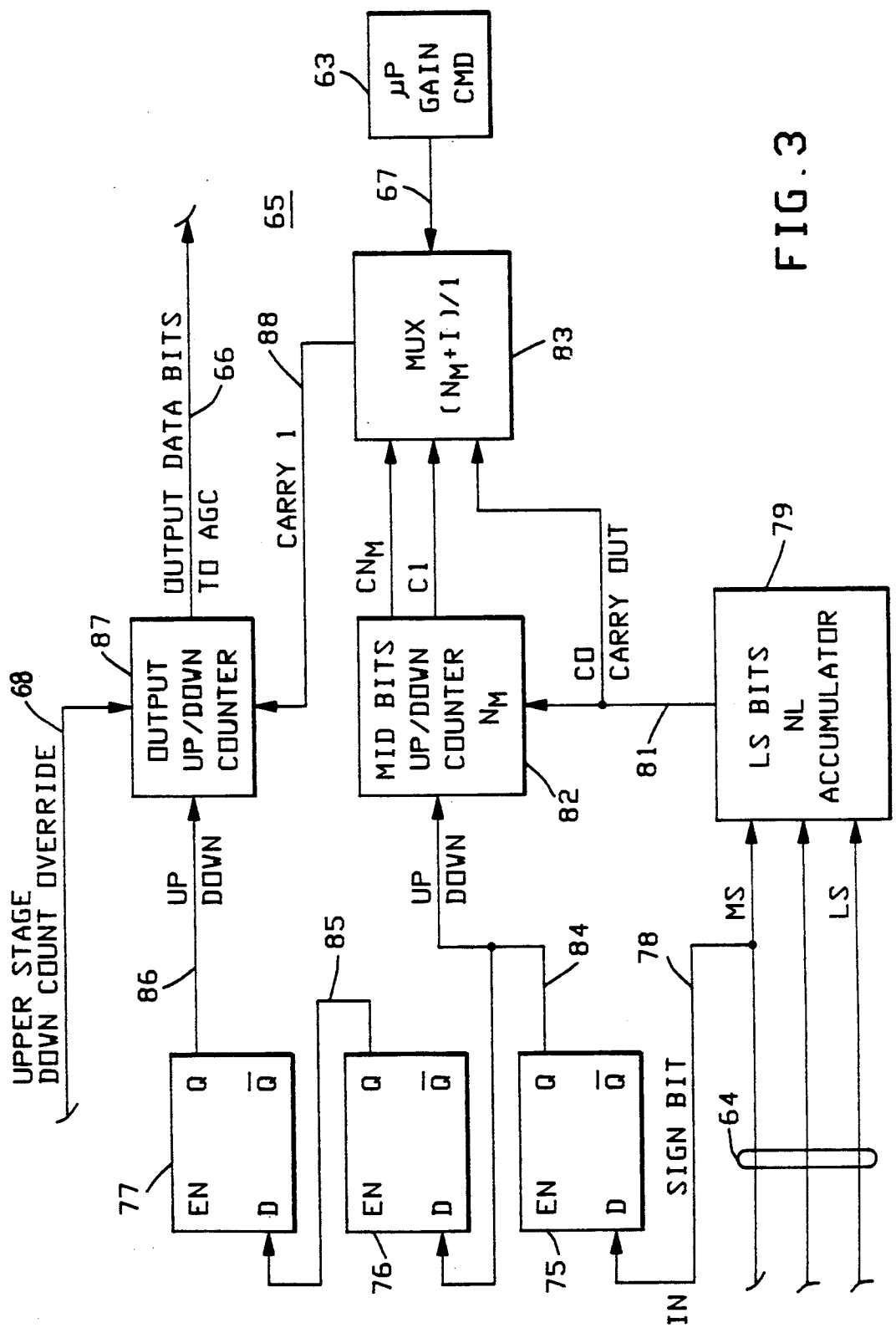
FIG. 3 is a detailed schematic block diagram of a preferred embodiment programmable gain accumulator of the type employed in FIG. 2.

Refer now to FIG. 3 showing a more detailed schematic block diagram of a preferred embodiment programmable gain accumulator of the type employed in FIG. 2. The programmable gain accumulator 65 is shown comprising a plurality of flip-flops connected in cascade one to another having an input sign bit on line 78. Line 78 is the most significant bit of the lines 64 which provide the error signal input. The accumulator 79 is shown having all of the error signal input bits on lines 64 applied thereto to provide a carry out signal on line 81 which is applied to the mid-bits up/down counter 82 and to the carry multiplexor 83. The real or Q output of flip-flop 75 on line 84 applies a delayed version of the input sign bit on line 78 to the mid-bits up/down counter 82 and to the data input of flip-flop 76. The twice delayed input sign bit on line 78 appears as the output of flip-flop 76 on line 85 as the data input to flip-flop 77. The thrice delayed input sign bit on line 78 now appears as the real output from flip-flop 77 on line 86 shown as an input to the output up/down counter 87. If the sign bit on line 78 is negative the signal on line 86 instructs the up/down counter 87 to count down on the appropriate carry input condition on line 88. Also the converse is true when the input sign bit on line 78 is positive the signal on line 86 instructs the up/down counter 87 to count up when the carry on line 88 is in the appropriate state. Thus, the digital output from the programmable gain accumulator 65 is shown as the output from the up/down counter 87 on line 66 as shown in FIG. 2. It will be understood that the control value on line 66 is attempting to maintain a steady state and seeking to make a zero average error signal on line 64 as shown in FIGS. 2 and 3. The carry on line 88 is selected in multiplexor 83 via the gain command on line 67. This allows a selected number of stages to be eliminated from the accumulator. This multiplexor 83 output is registered making it synchronous with the thrice delayed sign bit.

Figure 4:
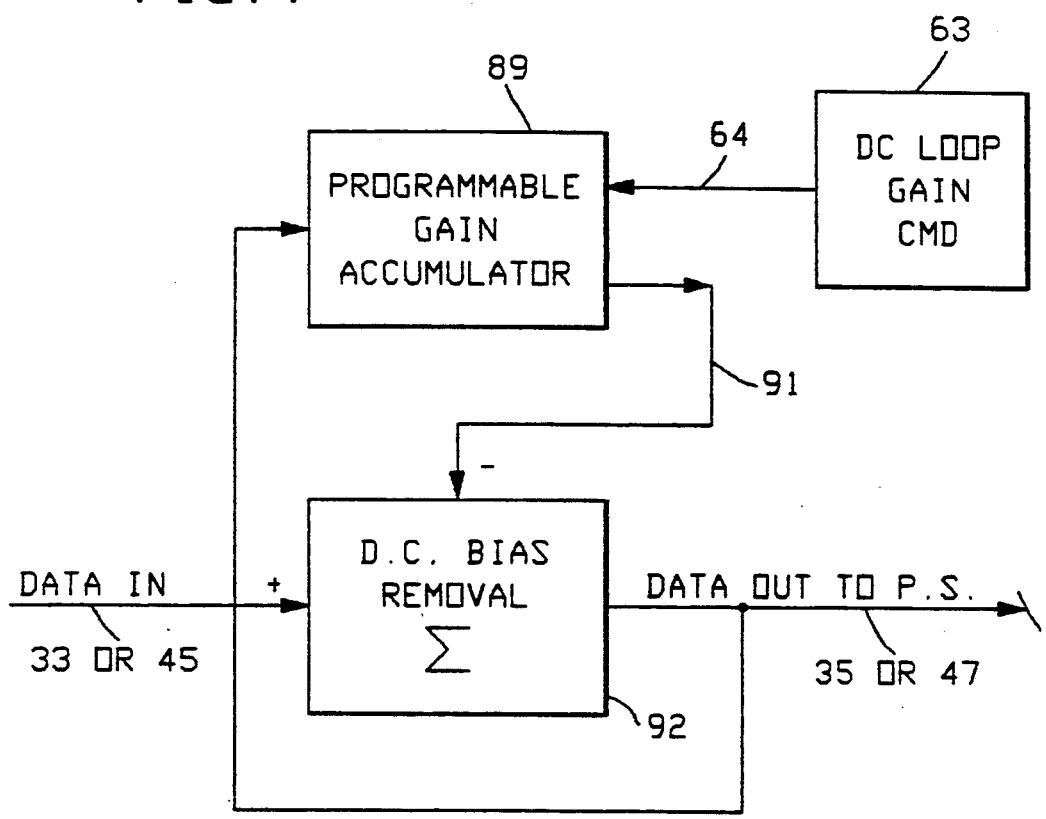
FIG. 4 is a block diagram of the programmable gain accumulator of FIGS. 2 and 3 connected to a bias removal circuit to provide D.C. removal signal processing.

Refer now to FIG. 4 showing a block diagram of a different programmable gain accumulator 89 connected to a bias removal circuit so as to provide D.C. removal signal processing of the type shown in FIG. 1 at blocks 34 and 46. The output of the programmable gain accumulator 89 on line 91 is applied as a negative input to a D.C. bias removal circuit shown as a summing circuit 92, which is shown having a data input line 33 or 45 and a D.C. unbiased data signal output to the phase shifter 36 on output line 35 or 47. In this example of signal processing, a D.C. loop gain command may be provided by the aforementioned microprocessor 63 or preset so as to provide the digital command signal on line 64 to the programmable gain accumulator 89. It will be understood that each of the D.C. removal circuits 34 and 46 may employ a circuit of the type shown in FIG. 4.

Having explained a preferred embodiment digital gain controller 11 which employs a preferred embodiment programmable gain accumulator 65 it will be understood that other forms of programmable gain accumulators may be employed in the same digital gain controller. It will now be apparent that the preferred embodiment digital gain controller is capable of sensing a saturation condition and rapidly and accurately overriding the proportional error signal in the automatic gain control circuits which respond and recover rapidly from large increases in interference signal power, thus, enhancing sensitivity and recovery of data.

The preferred embodiment programmable gain accumulator provides a synchronous output digital gain accumulator of the type which may be employed as an ideal integrator for various circuit uses. Further, the programmable gain accumulator may be remotely programmable or commandable by a remote microprocessor or a controller. And the novel circuitry of the programmable gain accumulator provides gain by multiplexing the carry rather than shifting the output of the value in the accumulator as was done in prior art variable gain accumulators.

What is claimed is:

1. A programmable digital gain controller of the type employed in the data stream of a channel of a digital communications receiver, comprising:
   amplifier means connected in the data stream of a receiver channel,
   digital detector means connected to said data stream for providing digital data magnitude output signals,
   digital comparator means coupled to said data magnitude signals,
   reference level signals coupled to said digital comparator means for providing gain error output signals from said comparator means, and
   digital programmable gain accumulator means coupled to said gain error output signals for providing digital gain commands which are coupled in a feedback loop to said amplifier means to provide a predetermined amplifier means output level,
   said digital programmable gain accumulator means having a proportional gain command level input for setting gain levels and having an overriding gain control input for overriding said digital gain command before being coupled to said amplifier means.

2. A programmable digital gain controller as set forth in claim 1 wherein said data stream comprises a real and an imaginary component each being coupled to said digital detector means,
   adder means coupled to the output of said digital detector means for providing said digital data magnitude signals coupled to said digital comparator means.

3. A programmable digital gain controller as set forth in claim 2 wherein said digital detector means comprises individual magnitude detectors coupled to said real and said imaginary components of said data stream.

4. A programmable digital gain controller as set forth in claim 3 wherein said individual magnitude detectors comprise absolute value detectors connected in series in said real and said imaginary components of said data stream.

5. A programmable digital gain controller as set forth in claim 3 wherein said individual magnitude detector means comprises square law detectors coupled in series and said real and said imaginary components of said data stream.

6. A programmable digital gain controller as set forth in claim 1 wherein said comparator means comprises a digital subtractor.

7. A programmable digital gain controller as set forth in claim 2 wherein said adder means comprises a digital summing circuit.

8. A programmable digital gain controller as set forth in claim 1 which further includes saturation control means coupled to said programmable gain accumulator means overriding gain control input and to said data stream for providing overriding gain control signal to said programmable gain accumulation means when the data stream signals are saturated.

9. A programmable digital gain controller as set forth in claim 8 wherein said saturation control means comprises a saturation detector coupled to said data stream.

10. A programmable digital gain controller as set forth in claim 9 wherein said saturation control means further comprises an up/down counter coupled to the output of said saturation detector.

11. A programmable digital gain controller as set forth in claim 10 wherein said saturation control means further comprises a multiplexor coupled to the carry output of said up/down counter and having an error signal output coupled to the input of said programmable gain accumulator means.

* * * * *